(12) United States Patent
Pham et al.

(10) Patent No.: US 8,669,147 B2
(45) Date of Patent: Mar. 11, 2014

(54) METHODS OF FORMING HIGH MOBILITY FIN CHANNELS ON THREE DIMENSIONAL SEMICONDUCTOR DEVICES

(75) Inventors: Daniel T. Pham, Clifton Park, NY (US); Robert J. Miller, Yorktown Heights, NY (US); Kingsuk Maitra, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/493,021

(22) Filed: Jun. 11, 2012

(65) Prior Publication Data

US 2013/0330916 A1    Dec. 12, 2013

(51) Int. Cl.
*H01L 21/00*    (2006.01)

(52) U.S. Cl.
USPC ........... 438/157; 257/369; 257/537; 257/722; 257/331; 257/270; 257/408; 438/197

(58) Field of Classification Search
CPC ............ H01L 29/785; H01L 29/66795; H01L 29/6681; H01L 29/66818; H01L 29/66803
USPC ......... 257/250, 270, 331, 722, 408, 369, 537; 438/157, 197
See application file for complete search history.

(56) References Cited

U.S. PATENT DOCUMENTS

| | | | |
|---|---|---|---|
| 6,921,982 B2 | 7/2005 | Joshi et al. | |
| 7,198,990 B2 | 4/2007 | Joshi et al. | |
| 7,314,802 B2 | 1/2008 | Zhu et al. | |
| 7,388,259 B2 | 6/2008 | Doris et al. | |
| 7,655,511 B2 | 2/2010 | Chidambarrao | |
| 7,872,303 B2 | 1/2011 | Chan et al. | |
| 8,174,073 B2 | 5/2012 | Lee et al. | |
| 8,247,275 B2 | 8/2012 | Hoentschel et al. | |
| 2006/0060925 A1* | 3/2006 | Doris et al. | 257/369 |
| 2008/0105900 A1 | 5/2008 | Joshi et al. | |
| 2011/0037103 A1* | 2/2011 | Yamaguchi et al. | 257/255 |
| 2011/0063019 A1* | 3/2011 | Chang et al. | 327/537 |
| 2011/0068407 A1 | 3/2011 | Yeh et al. | |
| 2011/0079829 A1 | 4/2011 | Lai et al. | |
| 2011/0133292 A1 | 6/2011 | Lee et al. | |
| 2011/0193178 A1* | 8/2011 | Chang et al. | 257/408 |
| 2011/0227162 A1 | 9/2011 | Lin et al. | |
| 2011/0233679 A1 | 9/2011 | Chen et al. | |
| 2012/0091528 A1* | 4/2012 | Chang et al. | 257/347 |
| 2012/0104472 A1 | 5/2012 | Xu et al. | |

OTHER PUBLICATIONS

Park et al., "Defect reduction of selective Ge epitaxy in trenches on Si(001) substrates using aspect ratio trapping," Applied Physics Letters, 90:052113, 2007.

* cited by examiner

*Primary Examiner* — Yu-Hsi D Sun
*Assistant Examiner* — Ratisha Mehta
(74) *Attorney, Agent, or Firm* — Amerson Law Firm, PLLC

(57) ABSTRACT

Disclosed herein are various methods of forming high mobility fin channels on three dimensional semiconductor devices, such as, for example, FinFET semiconductor devices. In one example, the method includes forming a plurality of spaced-apart trenches in a semiconducting substrate, wherein the trenches define an original fin structure for the device, and wherein a portion of a mask layer is positioned above the original fin structure, forming a compressively-stressed material in the trenches and adjacent the portion of mask layer, after forming the compressively-stressed material, removing the portion of the mask layer to thereby expose an upper surface of the original fin structure, and forming a final fin structure above the exposed surface of the original fin structure.

23 Claims, 7 Drawing Sheets

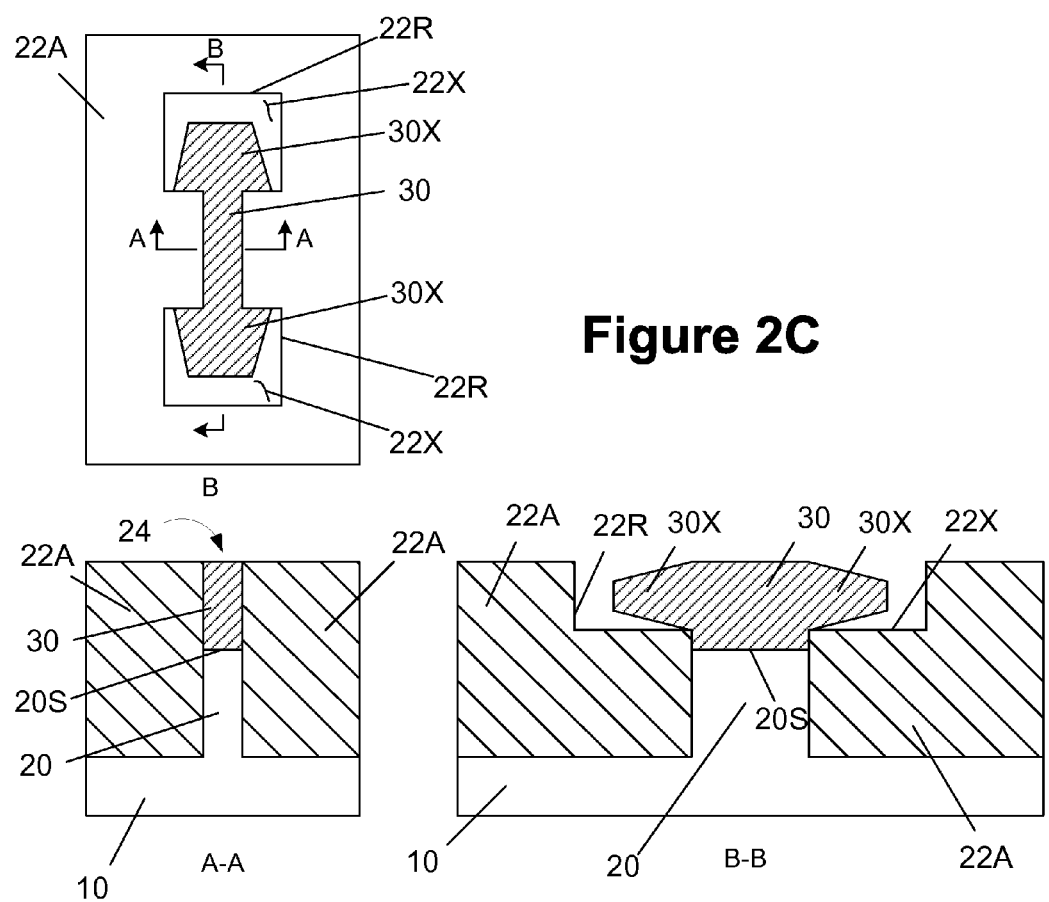

METHODS OF FORMING HIGH MOBILITY FIN CHANNELS ON THREE DIMENSIONAL SEMICONDUCTOR DEVICES

BACKGROUND OF THE INVENTION

1. Field of the Invention

Generally, the present disclosure relates to the manufacturing of sophisticated semiconductor devices, and, more specifically, to various methods of forming high mobility fin channels on three dimensional (3D) semiconductor devices, such as, for example, FinFET semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

The use of materials other than silicon for FinFET devices has been attempted. For example, it has been contemplated to manufacture at least part of a FinFET device from so-called "III-V" materials. However, there have been several problems associated with such devices, and particularly the manufacturing of such devices. One problem associated with manufacturing devices from such III-V material is that such materials are very difficult to etch to the very small and controllable feature sizes required in current-day devices and products. Additionally, problems have been encountered when attempting to epitaxially grow a III-V material, such as gallium arsenide, on a crystalline silicon material. The crystals in a typical III-V material are much larger than the crystals in a crystalline semiconductor material. This mismatch in crystal size causes the formation of a relatively large number of defects, such as point defects, in epitaxially grown III-V material. These defects tend to be so-called mid-point defects which, among other things, tends to make the III-V material very difficult to etch. In some cases, efforts have been made to alleviate this problem by forming a buffer layer on the silicon surface and thereafter forming the III-V material above the buffer layer. The buffer layer is typically made of a material, such as indium nitride, that has a crystal size that is intermediate the silicon and the III-V material, such as gallium arsenide. However, the use and formation of such buffer layers makes the manufacturing of modern integrated circuits with very small feature sizes even more difficult and problematic, and the use of such buffer layers in manufacturing has not achieved widespread success.

The present disclosure is directed to various methods of forming high mobility semiconductor fins on three dimensional (3D) semiconductor devices, such as, for example, FinFET semiconductor devices, that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming high mobility fin channels on three dimensional (3D) semiconductor devices, such as, for example, FinFET semiconductor devices. In one example, the method includes forming a plurality of spaced-apart trenches in a semiconducting substrate, wherein the trenches define an original fin structure for the device, and wherein a portion of a mask layer is positioned above the original fin structure, forming a compressively-stressed material in the trenches and adjacent the portion of mask layer, after forming the compressively-stressed material, removing the portion of the mask layer to thereby expose an upper surface of the original fin structure, and forming a final fin structure above the exposed surface of the original fin structure.

In another illustrative example, a method is disclosed that includes forming a plurality of spaced-apart trenches in a semiconducting substrate by performing an etching process through a patterned mask layer positioned above the substrate, wherein the trenches define an original fin structure for the device, and wherein a portion of the patterned mask layer is positioned above the original fin structure, forming a compressively-stressed material in the trenches and adjacent the portion of the patterned mask layer, after forming the compressively-stressed material, performing an etching process to remove the portion of the patterned mask layer to thereby expose an upper surface of the original fin structure and thereby define a cavity, and performing an epitaxial deposition process to form a final fin structure in the cavity above the exposed surface of the original fin structure.

BRIEF DESCRIPTION OF THE DRAWINGS

The disclosure may be understood by reference to the following description taken in conjunction with the accompanying drawings, in which like reference numerals identify like elements, and in which:

FIGS. 2A-2C depict another illustrative method disclosed herein of forming high mobility semiconductor fins on three dimensional semiconductor devices, such as, for example, FinFET semiconductor devices.

Figure 1A:
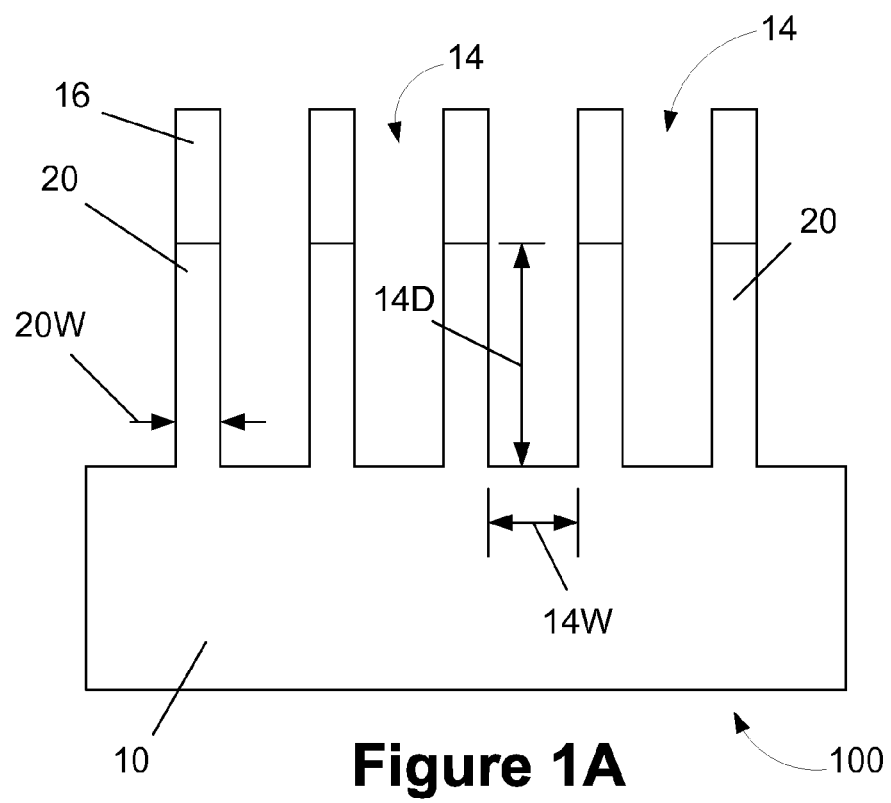
FIGS. 1A-1H depict one illustrative method disclosed herein of forming high mobility semiconductor fins on 3D semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming high mobility fin channels on three dimensional (3D) semiconductor devices, such as, for example, FinFET semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process and thereafter patterned using known sidewall image transfer techniques and/or photolithographic techniques combined with performing known etching techniques.

With continuing reference to FIG. 1A, an etching process, such as a dry or wet etching process, is performed on the substrate 10 through the patterned mask layer 16 to form a plurality of trenches 14. This etching process results in the definition of a plurality of original fin structures 20. The overall size, shape and configuration of the trenches 14 and the original fin structure 20 may vary depending on the particular application. The depth 14D and width 14W of the trenches may vary depending upon the particular application. In one illustrative embodiment, based on current day technology, the depth 14D of the trenches 14 may range from approximately 100-350 nm and the width 14W of the trenches 14 may range from about 15-80 nm. In some embodiments, the original fin structure 20 may have a width 20W within the range of about 10-30 nm. In the illustrative example depicted in FIGS. 1A-1G, the trenches 14 and the original fin structure 20 are all of a uniform size and shape. However, as discussed more fully below, such uniformity in the size and shape of the trenches 14 and the original fin structure 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
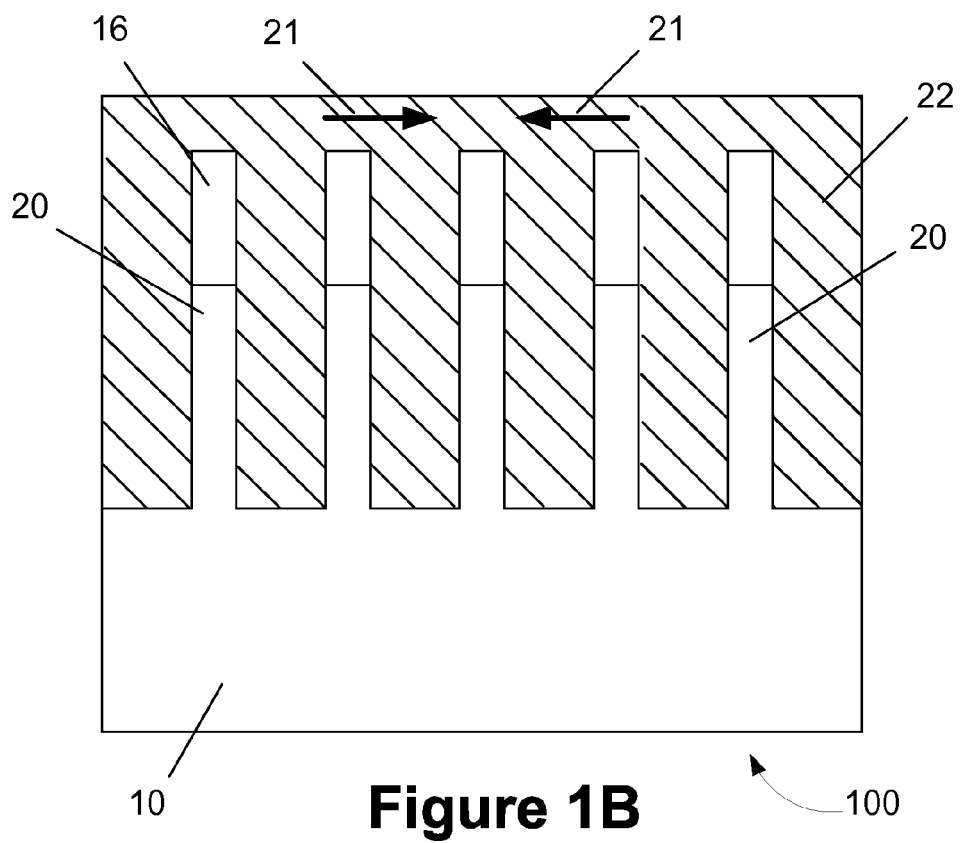

Then, as shown in FIG. 1B, a compressively stressed layer of material 22 is formed in the trenches 14 of the device. The compressively-stressed layer of material 22 may be comprised of a variety of different materials, such as, for example, silicon nitride, hafnium silicate, etc., and it may be formed by performing a variety of techniques, e.g., CVD, ALD, etc. In one illustrative embodiment, the compressively-stressed layer of material 22 may be a layer of silicon nitride that is formed by performing a CVD process. The compressively-stressed layer of material 22 is formed such that it has a compressive stress, as reflected by the arrows 21. In some embodiments, the compressively-stressed layer of material 22 is formed such that it has a compressive stress of at least 10 MPa. The manner in which such a compressively-stressed layer of material 22 may be formed so as to impart the desired stress are well known to those skilled in the art. Such a compressively-stressed layer of material 22 may have the desired stress level directly as a result of the process of formation (intrinsic stress) or as a result of stress being thermally induced (a material deposited typically at an elevated temperature, having a thermal expansion coefficient substantially different from that of the substrate), or a combination of intrinsic and thermally-induced stress.

Figure 1C:
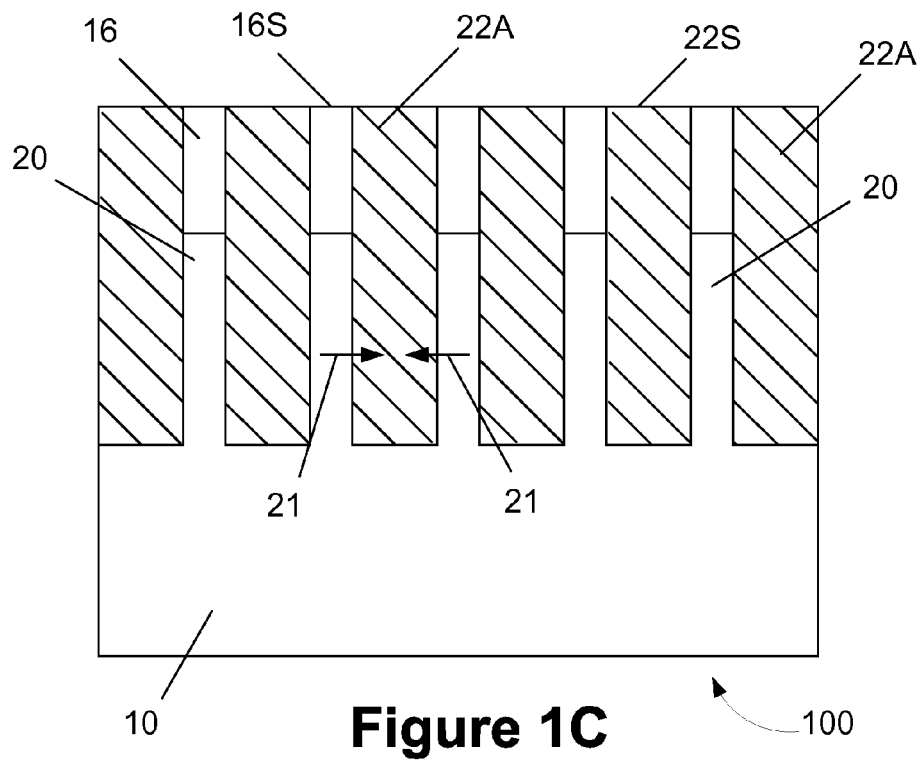

FIG. 1C depicts the device 100 after a chemical mechanical polishing (CMP) process has been performed on the compressively-stressed layer of material 22. During the CMP process, the patterned mask layer 16 acts as a polish-stop layer. This CMP process results in the definition of a plurality of regions of compressively stressed material 22A. Each of the regions of compressively stressed material 22A still have substantially the same compressive stress as was present in the original compressively-stressed layer of material 22.

Figure 1D:
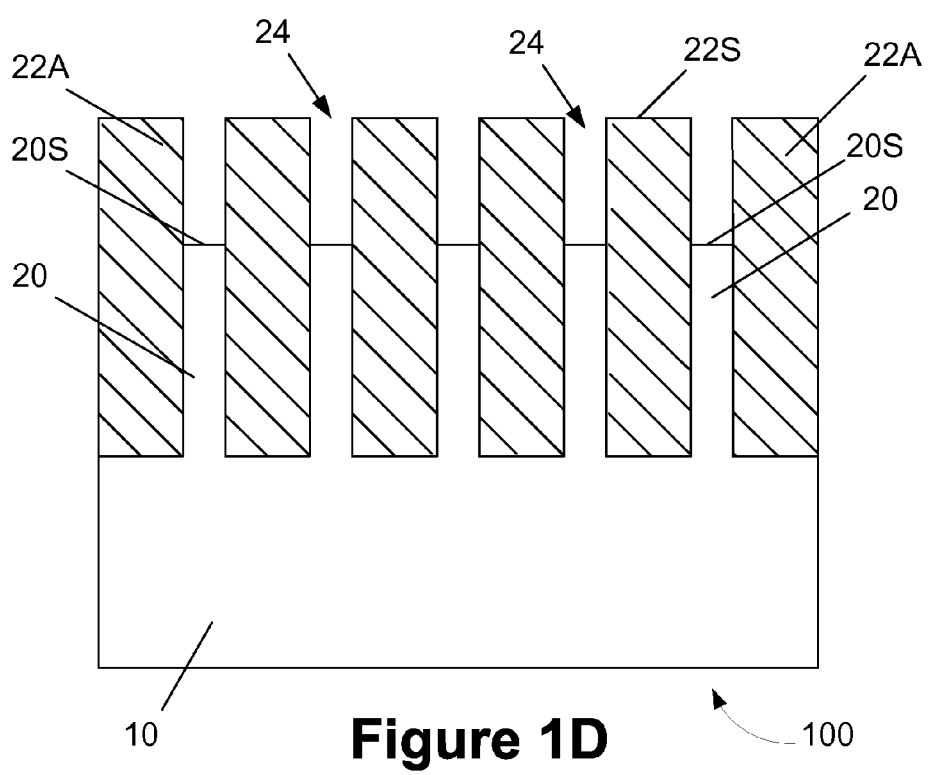

Next, as shown in FIG. 1D, an etching process (wet or dry) is performed to selectively remove the material of the patterned mask layer 16 relative to the compressively-stressed layer of material 22. This etching process results in the formation of a plurality of cavities 24 above the original fin structures 20 and exposes an upper surface 20S of the original fin structure 20.

Figure 1E:
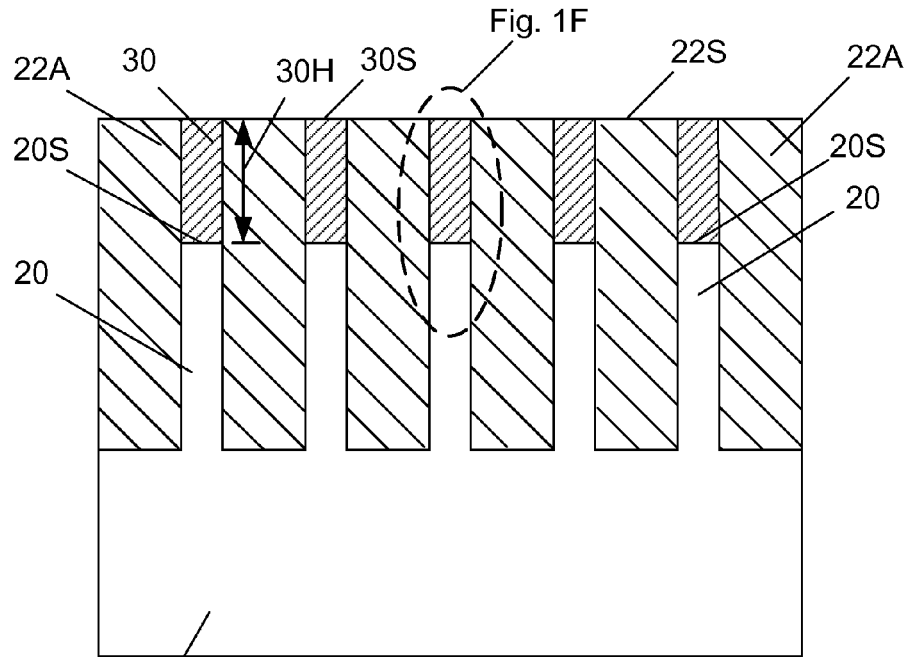
Figure 1F:
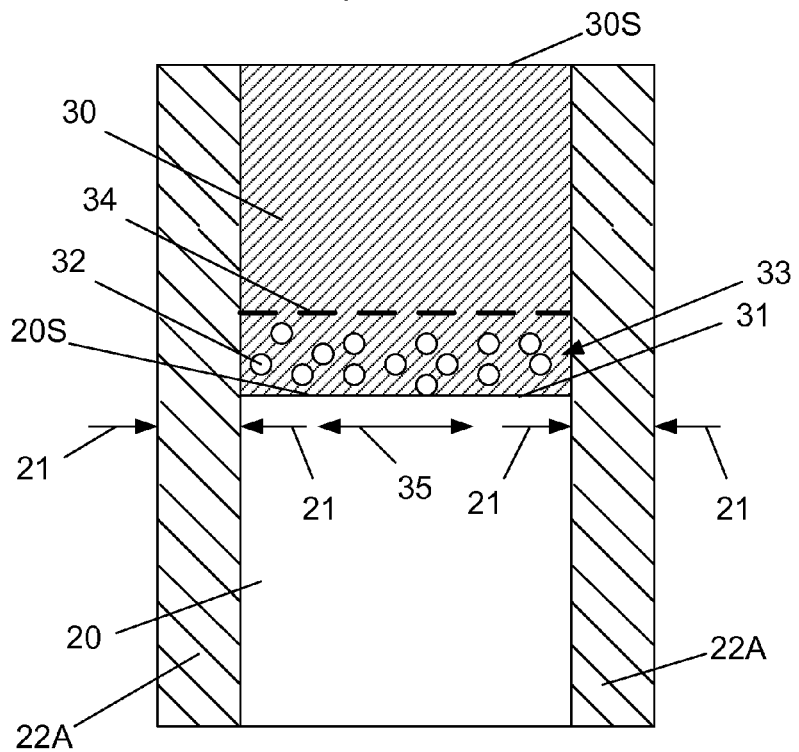

Next, as shown in FIGS. 1E-1F, final fin structures 30 for the device 100 are formed in the cavities 24. The final fin structures 30 may be made of a variety of materials, such as, for example, any of the so-called "III-V" materials, germanium, silicon germanium, etc., or combinations thereof. For example, a bottom portion of the fin may be made of a material with a medium size crystal structure while the upper portion of the fin being made of a material with a larger crystal structure, wherein the bottom portion of the fin effectively acts as a transition layer. The final fin structures 30 may be formed by performing a variety of processes, e.g., epitaxial formation, CVD, ALD, molecular beam evaporation (MBE), etc. In one illustrative embodiment, where the fin 20 is comprised of silicon, the final fin structure 30 may be comprised of gallium arsenide and it may be formed by performing an epitaxial deposition process. If necessary or desired, a CMP process may be performed on the material used to form the final fin structure 30 to planarize its upper surface using the regions of compressively stressed material 22A as a polish-stop layer, whereby the upper surface 30S of the final fin structures 30 is approximately planar with the upper surface 22S of the regions of compressively stressed material 22A. Of course, in some applications, the aforementioned CMP process may not be performed. The fin height 30H of the final fin structures 30 may vary depending upon the particular application and, in one illustrative embodiment, may range from about 5-50 nm.

FIG. 1F is an enlarged view depicting a region near the interface 31 between the original fin structure 20 and the final fin structure 30 along the upper surface 20S of the original fin structure 20. Due to the mismatch in crystal size between the material of the original fin structures 20 (smaller crystal structure) and the material of the final fin structure 30 (larger crystal structure), schematically depicted defects 32, such as, for example, so-called point defects, may form near the interface 31. Given the crystalline nature of the original fin material 20 and the material of the final fin structure 30, the defects 32 tend to propagate upward from the interface 31 toward the upper surface 30S of the final fin structure 30. However, the defects 32 also tend to migrate in a certain direction, e.g., at 45 degrees, due to the crystalline structure of the material of the final fin structure 30. Thus, the ability of the defects 32 to propagate upward is limited to a defect-containing region 33 that is bounded on the top by the dashed line 34. The depth or thickness of this defect-containing region 33 may vary depending upon the particular application, e.g., the materials of construction used for the original fin structures 20 and the final fin structures 30, as well as the manner in which the final fin structure 30 is formed. In one illustrative example, where the fin height 30H may be about 50 nm, the defect-containing region 33 may have a thickness of about 15 nm.

With continuing reference to FIG. 1F, the compressive stress 21 in the regions of compressively stressed material 22A causes the surface 20S of the original fin structure 20 to be in tension, as reflected by the double-arrow line 35. The tension 35 effectively increases the size of the crystals in the material of the original fin structure 20. By reducing the size difference between the crystals in the original fin structure 20 and the crystals in the final fin structure 30 that is formed thereabove, the formation of the final fin structures 30 may be achieved with fewer defects 32. In some cases, as noted above, graded layers of material with varying crystal size (from small to large) may also be employed to fit both materials.

Figure 1G:
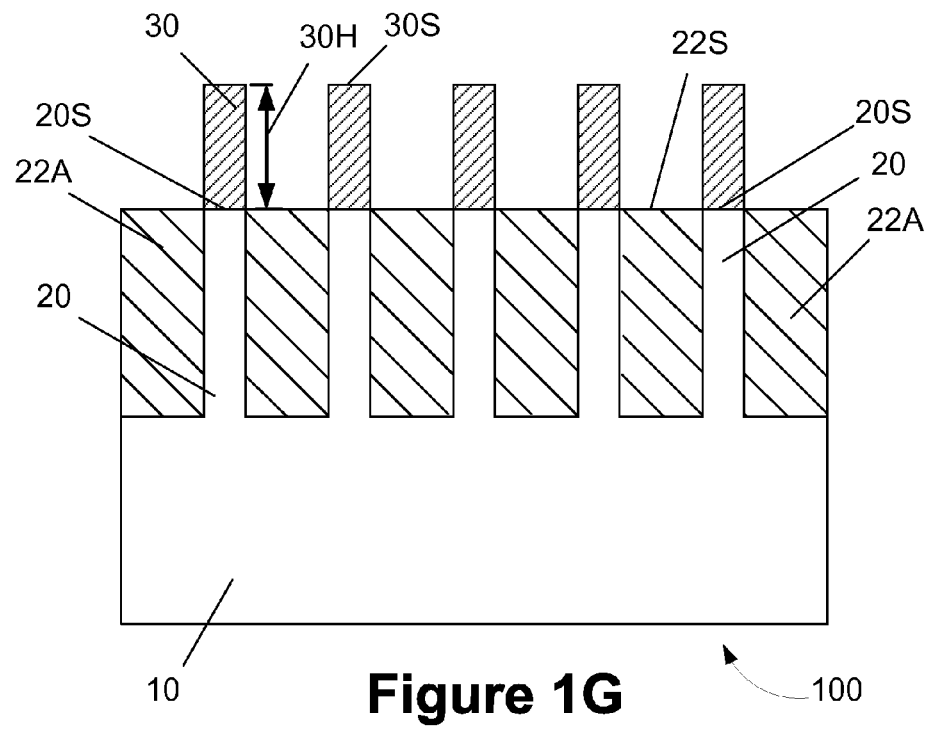
Figure 1H:
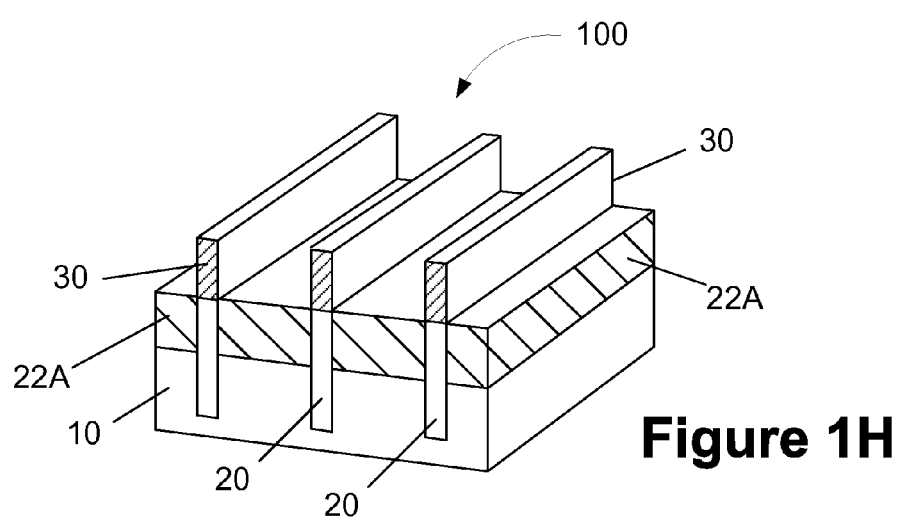

FIGS. 1G-1H depict the illustrative FinFET device 100 after an etching process has been performed to reduce the thickness of the regions of compressively-stressed material 22A. At this point, traditional fabrication techniques may be employed to complete the fabrication of the device 100.

Figure 2A:
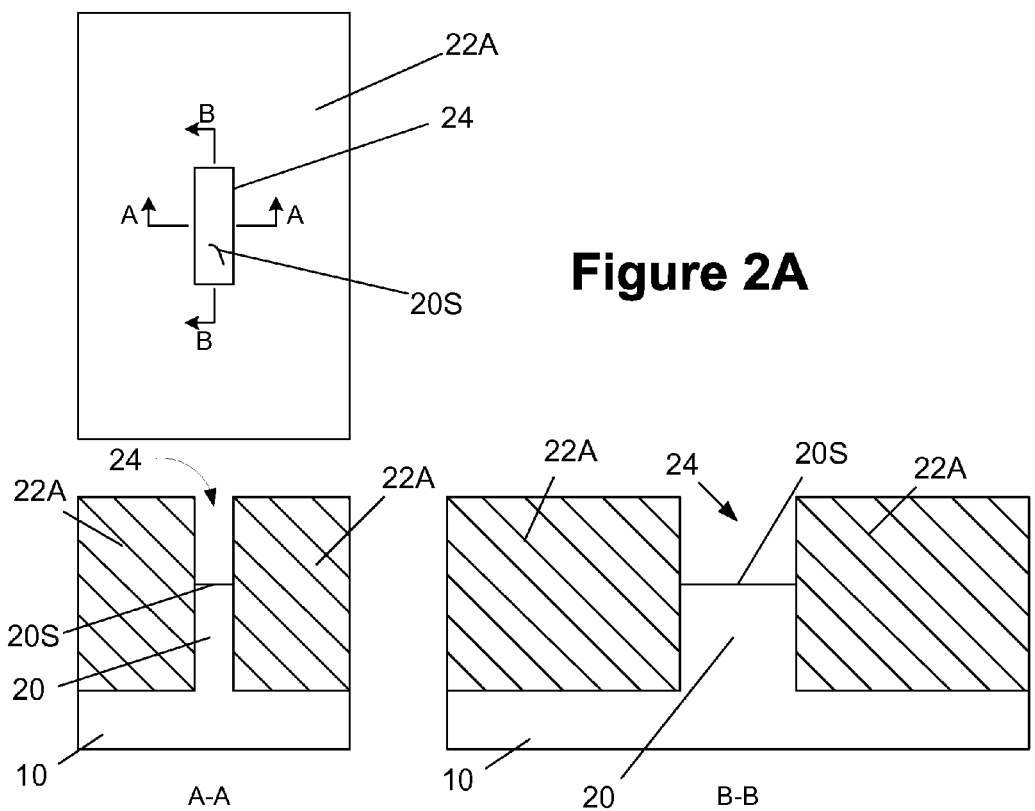
Figure 2B:
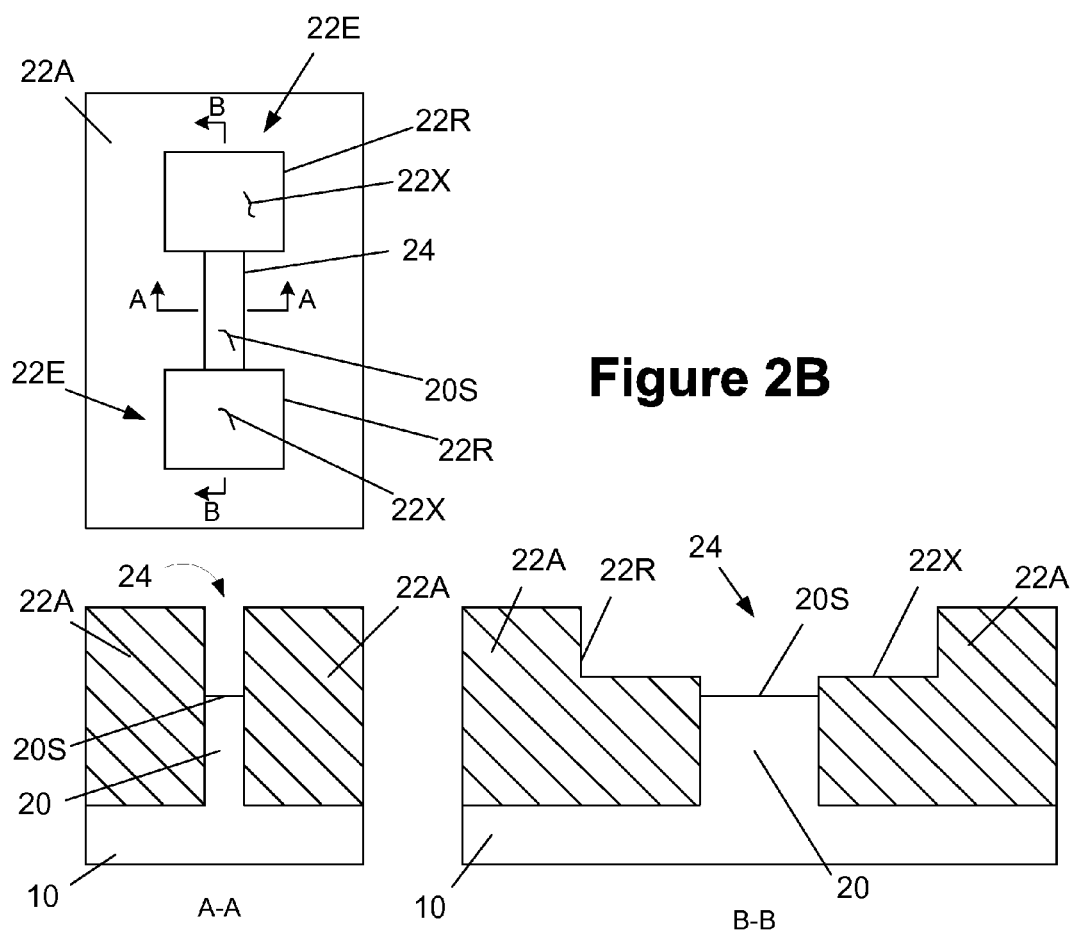

FIGS. 2A-2C depict another illustrative method disclosed herein that may be used in conjunction with the methods described above. FIGS. 2A-2C each depict a top view of the device 100 and section views "A-A" and "B-B" taken along the planes indicated in the top view in those drawings. FIG. 2A depicts the device 100 at a stage of fabrication that approximately corresponds to that shown in FIG. 1D, where the cavities 24 have been formed above the original fin structure 20 by removing the patterned mask layer 16. As can be seen in the top view shown in FIG. 2A, the illustrative cavity 24 has a generally rectangular configuration with its shorter dimension in the "A-A" direction and its longer dimension in the "B-B" direction. The cavity 24 is positioned within the regions of compressively stressed material 22A, and the upper surface 20S of the original fin structure 20 is exposed by the cavity 24.

FIG. 2B depicts the device 100 after a recess 22R has been formed in the regions of compressively stressed material 22A. The recess 22R has a bottom surface 22X that is at a higher level than the upper surface 20S of the original fin structure 20. The depth of the recess 22R may vary depending upon the particular application. The distance between the bottom surface 22X and the upper surface 20S can be adjusted such that the difference in height between these two surfaces may be at least equal to the anticipated thickness of defect-containing region 33 (see FIG. 1F). As can be seen in the top view in FIG. 2B, the recess 22R is sized and configured such that it provides enlarged areas 22E on opposite ends of the original cavity 24. In this embodiment, the original cavity 24 and the recess 22R form a common opening above the upper surface 20S of the original fin structure 20. Of course, the size, shape and configuration of the recess 24 and the enlarged regions 22E may be varied depending upon the particular application. In the illustrative example depicted herein, the enlarged regions 24E have a substantially rectangular configuration. The recess 24 may be formed by performing a timed etching process through a patterned mask layer (not shown) using traditional photolithographic tools and techniques.

FIG. 2C depicts the device 100 after material for the final fin structure 30 has been formed. In this example, the final fin structure 30 may be formed by performing an epitaxial deposition process wherein the final fin structure 30 includes enlarged regions 30X that make the process of forming conductive contacts (not shown) to the final fin 30 easier to accomplish. As can be seen in the top view in FIG. 2C, the final fin structure 30 comprises enlarged regions 30X positioned on opposite ends of the smaller central portion of the fin 30. The recess 24 is sized and configured to allow the formation of the enlarged regions 30X and to allow for subsequent formation of metal silicide regions (not shown) on the exposed surfaces of the final fin structure 30, including the enlarged regions 30X as well as, to at least some degree, the underside of the enlarged regions 30X of the final fin structure 30. The typical steps performed to form metal silicide regions are: (1) depositing a layer of refractory metal; (2) performing an initial heating process causing the refractory metal to react with underlying silicon-containing material; (3) performing an etching process to remove unreacted portions of the layer of refractory metal; and (4) performing an additional heating process to form the final phase of the metal silicide. The details of such silicidation processes are well known to those skilled in the art. After such metal silicide regions are formed, the device 100 may be completed by performing traditional manufacturing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a device, comprising:
   forming a plurality of spaced-apart trenches in a semiconducting substrate, said trenches defining an original fin structure for said device, wherein a portion of a mask layer is positioned above said original fin structure;
   forming a compressively-stressed material in said trenches and adjacent said portion of said mask layer;
   after forming said compressively-stressed material, removing said portion of said mask layer to form a cavity in said compressively-stressed material, wherein a bottom of said cavity exposes an upper surface of said original fin structure;
   forming a final fin structure at least in said cavity above said exposed surface of said original fin structure; and
   removing a portion of said compressively-stressed material so as to expose at least sidewall surfaces of said final fin structure.

2. The method of claim 1, wherein forming said plurality of spaced-apart trenches comprises performing an etching process through a patterned mask layer that comprises said portion of said mask layer.

3. The method of claim 1, wherein forming said compressively-stressed material comprises performing one of a chemical vapor deposition process or an atomic layer deposition process to form said compressively-stressed material.

4. The method of claim 3, wherein forming said compressively-stressed material further comprises performing a chemical mechanical polishing process.

5. The method of claim 1, wherein forming said compressively-stressed material comprises forming said compressively-stressed material such that it exhibits a compressive stress of at least about 10 MPa.

6. The method of claim 1, wherein said semiconducting substrate is comprised of silicon and said final fin structure is comprised of one of a III-V material, germanium or silicon germanium.

7. The method of claim 1, wherein removing said portion of said mask layer comprises performing an etching process that is adapted to remove said portion of said mask layer relative to said compressively-stressed material.

8. The method of claim 1, wherein forming said final fin structure comprises performing one of an epitaxial deposition process, a chemical vapor deposition process or an atomic layer deposition process to form said final fin structure.

9. The method of claim 1, wherein forming said final fin structure comprises forming a final fin structure comprised of enlarged regions on opposite ends of a central region of said final fin structure.

10. The method of claim 1, wherein, prior to forming said final fin structure, forming a recess in said compressively-stressed material that forms a common opening with said cavity, said recess having a bottom surface that is positioned at a level that is above a level at which said exposed upper surface of said original fin structure is positioned.

11. A method of forming a device, comprising:
    forming a plurality of spaced-apart trenches in a semiconducting substrate by performing an etching process through a patterned mask layer positioned above said substrate, said trenches defining an original fin structure for said device, wherein a portion of said patterned mask layer is positioned above said original fin structure;
    forming a compressively-stressed material in said trenches and adjacent said portion of said patterned mask layer;
    after forming said compressively-stressed material, performing an etching process to remove said portion of said patterned mask layer to thereby expose an upper surface of said original fin structure and thereby define a cavity;
    performing an epitaxial deposition process to form a final fin structure in said cavity above said exposed surface of said original fin structure; and removing a portion of said compressively-stressed material so as to expose at least sidewall surfaces of said final fin structure.

12. The method of claim 11, wherein said semiconducting substrate is comprised of silicon and said final fin structure is comprised of one of a III-V material, germanium or silicon germanium.

13. The method of claim 11, wherein said etching process is adapted to remove said portion of said patterned mask layer relative to said compressively-stressed material.

14. The method of claim 11, wherein forming said final fin structure comprises forming a final fin structure comprised of enlarged regions on opposite ends of a central region of said final fin structure.

15. The method of claim 11, wherein, prior to forming said final fin structure, forming a recess in said compressively-stressed material that forms a common opening with said cavity, said recess having a bottom surface that is positioned at a level that is above a level at which said exposed upper surface of said original fin structure is positioned.

16. The method of claim 11, wherein forming said compressively-stressed material comprises forming said compressively-stressed material such that it exhibits a compressive stress of at least about 10 MPa.

17. A method of forming a device, comprising:
- forming a plurality of spaced-apart trenches in a semiconducting substrate comprised of silicon by performing an etching process through a patterned mask layer positioned above said substrate, said trenches defining an original fin structure for said device, wherein a portion of said patterned mask layer is positioned above said original fin structure;
- performing a chemical vapor deposition process to form a compressively-stressed material comprised of silicon nitride in said trenches and adjacent said portion of said patterned mask layer;
- after forming said compressively-stressed material, performing an etching process to remove said portion of said patterned mask layer to thereby expose an upper surface of said original fin structure and thereby define a cavity;
- performing an epitaxial deposition process to form a final fin structure comprised of a III-V material in said cavity above said exposed surface of said original fin structure; and
- removing a portion of said compressively-stressed material so as to expose at least sidewall surfaces of said final fin structure.

18. The method of claim 17, wherein said etching process is adapted to remove said portion of said patterned mask layer relative to said compressively-stressed material.

19. The method of claim 17, wherein forming said final fin structure comprises forming a final fin structure comprised of enlarged regions on opposite ends of a central region of said final fin structure.

20. The method of claim 17, wherein, prior to forming said final fin structure, forming a recess in said compressively-stressed material that forms a common opening with said cavity, said recess having a bottom surface that is positioned at a level that is above a level at which said exposed upper surface of said original fin structure is positioned.

21. The method of claim 17, wherein forming said compressively-stressed material comprises forming said compressively-stressed material such that it exhibits a compressive stress of at least about 10 MPa.

22. A method of forming a device, comprising:
- forming a plurality of spaced-apart trenches in a semiconducting substrate, said trenches defining an original fin structure for said device, wherein a portion of a mask layer is positioned above said original fin structure;
- forming a compressively-stressed material in said trenches and adjacent said portion of said mask layer;
- after forming said compressively-stressed material, removing said portion of said mask layer to thereby expose an upper surface of said original fin structure;
- forming a recess in said compressively-stressed material that forms a common opening with a cavity above said original fin structure, said recess having a bottom surface that is positioned at a level that is above a level at which said exposed upper surface of said original fin structure is positioned; and
- after forming said recess, forming a final fin structure above said exposed surface of said original fin structure.

23. The method of claim 11, wherein said final fin structure is formed only on said upper surface of said original fin structure.

* * * * *